(12) United States Patent
Takeda

(10) Patent No.: US 9,263,365 B2
(45) Date of Patent: Feb. 16, 2016

(54) ELECTRONIC COMPONENT AND ELECTRONIC COMPONENT COOLING METHOD

(71) Applicant: NEC Corporation, Minato-ku, Tokyo (JP)

(72) Inventor: Tsutomu Takeda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 55 days.

(21) Appl. No.: 14/182,426

(22) Filed: Feb. 18, 2014

(65) Prior Publication Data
US 2014/0254099 A1  Sep. 11, 2014

(30) Foreign Application Priority Data
Mar. 6, 2013  (JP) .................................. 2013-044255

(51) Int. Cl.
*H05K 7/20* (2006.01)
*H01L 23/473* (2006.01)
*H01L 23/367* (2006.01)
(Continued)

(52) U.S. Cl.
CPC .......... *H01L 23/473* (2013.01); *H01L 23/3677* (2013.01); *H01L 25/0657* (2013.01); *H01L 29/0657* (2013.01); *H01L 23/49827* (2013.01); *H01L 24/16* (2013.01); *H01L 24/32* (2013.01); *H01L 2224/16145* (2013.01); *H01L 2224/16225* (2013.01); *H01L 2224/32225* (2013.01); *H01L 2224/73204* (2013.01); *H01L 2225/06513* (2013.01); *H01L 2225/06527* (2013.01); *H01L 2225/06541* (2013.01); *H01L 2225/06555* (2013.01); *H01L 2225/06558* (2013.01); *H01L 2225/06565* (2013.01); *H01L 2225/06589* (2013.01); *H01L 2924/0002* (2013.01); *H01L 2924/00014* (2013.01);
(Continued)

(58) Field of Classification Search
CPC ........ H05K 7/20263; H05K 7/20; G06F 1/20; G06F 17/5068; F28D 9/0093; H01L 23/34; H01L 25/0657; H01L 23/473; H01L 23/3677
USPC ........................ 361/679.46–679.53, 688, 689, 361/698–703, 715, 719, 722–724; 165/80.4, 80.5, 104.26, 104.33, 121, 165/165, 185; 257/686, 698, 707, 713, 714, 257/722, 726; 174/15.1, 15.2, 16.3, 252; 438/109, 122, 413, 368, 426; 62/259.2
See application file for complete search history.

(56) References Cited

U.S. PATENT DOCUMENTS 4,573,067 A * 2/1986 Tuckerman ........... F28D 15/046
257/684
5,057,908 A * 10/1991 Weber ................. H01L 23/3731
257/714

(Continued)

FOREIGN PATENT DOCUMENTS

JP     2006019730 A    1/2006
JP     2010-153799 A   7/2010
(Continued)

*Primary Examiner* — Michail V Datskovskiy

(57) ABSTRACT

An electronic component includes a base substance, a cooling channel formed in the base substance and flows a cooling medium in a second direction from a first direction, a radiator formed in a surface of the cooling channel using a material of which thermal conductivity is higher than a thermal conductivity of the base substance or formed so that the radiator may project to the cooling channel, and that contacts the cooling medium.

9 Claims, 15 Drawing Sheets

(51) Int. Cl.
*H01L 25/065* (2006.01)
*H01L 29/06* (2006.01)
*H01L 23/42* (2006.01)
*H01L 23/498* (2006.01)
*H01L 23/00* (2006.01)

(52) U.S. Cl.
CPC ............... *H01L 2924/10157* (2013.01); *H01L 2924/10158* (2013.01); *H01L 2924/15311* (2013.01)

(56) References Cited

U.S. PATENT DOCUMENTS

| | | | | |
|---|---|---|---|---|
| 5,070,040 | A * | 12/1991 | Pankove | 438/106 |
| 5,262,673 | A * | 11/1993 | Mikoshiba et al. | 257/712 |
| 5,313,361 | A * | 5/1994 | Martin ............... H01L 23/473 | 165/80.3 |
| 6,129,145 | A * | 10/2000 | Yamamoto et al. | 165/168 |
| 6,437,981 | B1 * | 8/2002 | Newton et al. | 361/700 |
| 6,521,516 | B2 * | 2/2003 | Monzon ............... H01L 23/473 | 257/714 |
| 6,785,134 | B2 * | 8/2004 | Maveety ............... H01L 23/42 | 165/80.4 |
| 6,785,135 | B2 * | 8/2004 | Ohmi et al. | 361/700 |
| 6,919,231 | B1 * | 7/2005 | Ramanathan et al. | 438/122 |
| 6,942,021 | B2 * | 9/2005 | Makino et al. | 165/104.26 |
| 6,999,314 | B2 * | 2/2006 | Tonosaki et al. | 361/700 |
| 7,032,392 | B2 * | 4/2006 | Koeneman et al. | 62/77 |
| 7,204,298 | B2 * | 4/2007 | Hodes et al. | 165/80.4 |
| 7,215,547 | B2 * | 5/2007 | Chang et al. | 361/701 |
| 7,358,201 | B2 * | 4/2008 | Ramanathan ......... H01L 23/473 | 257/E23.098 |
| 7,427,566 | B2 * | 9/2008 | Durocher ............... F28F 3/12 | 165/168 |
| 7,466,732 | B2 * | 12/2008 | Stephens, IV ...... H01S 5/02423 | 372/35 |
| 7,538,425 | B2 * | 5/2009 | Myers et al. | 257/714 |
| 7,550,841 | B2 * | 6/2009 | Dory | 257/722 |
| 7,569,426 | B2 * | 8/2009 | Myers ............... H01L 23/473 | 257/E21.499 |
| 7,652,372 | B2 * | 1/2010 | Dishongh et al. | 257/714 |
| 7,882,624 | B2 * | 2/2011 | Hu et al. | 29/832 |
| 7,928,425 | B2 * | 4/2011 | Rao | 257/20 |
| 7,936,563 | B2 * | 5/2011 | Gosset ............... H01L 21/7682 | 257/713 |
| 7,990,711 | B1 * | 8/2011 | Andry et al. | 361/699 |
| 8,159,065 | B2 * | 4/2012 | Suh et al. | 257/712 |
| 8,563,365 | B2 * | 10/2013 | King et al. | 438/122 |
| 8,616,266 | B2 * | 12/2013 | Wilcoxon et al. | 165/80.4 |
| 8,766,433 | B2 * | 7/2014 | Avenas et al. | 257/713 |
| 2003/0110788 | A1 * | 6/2003 | Koeneman et al. | 62/259.2 |
| 2006/0145356 | A1 * | 7/2006 | Liu et al. | 257/777 |
| 2009/0251862 | A1 * | 10/2009 | Knickerbocker et al. | 361/699 |

FOREIGN PATENT DOCUMENTS

| | | |
|---|---|---|
| JP | 2011023451 A | 2/2011 |
| JP | 2012-138473 A | 7/2012 |

\* cited by examiner

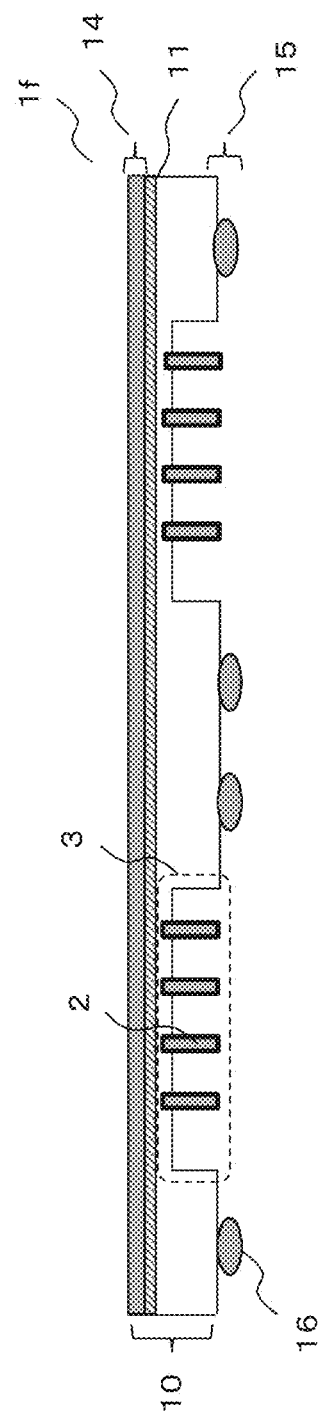

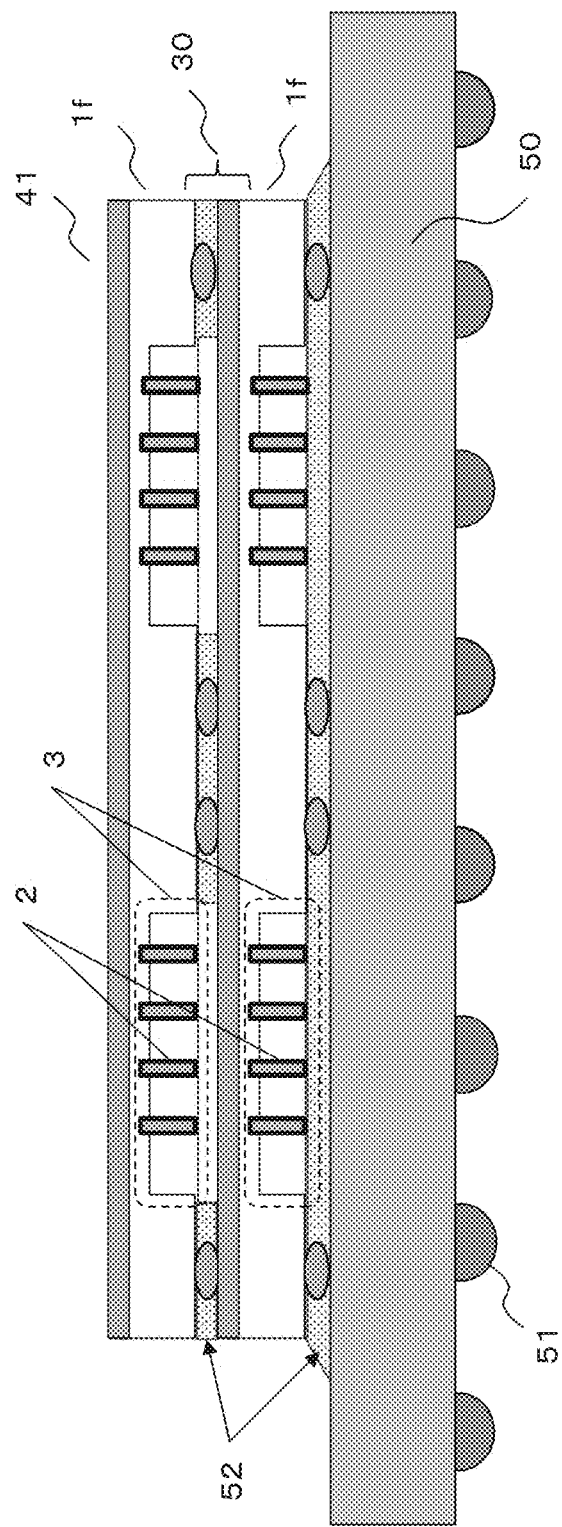

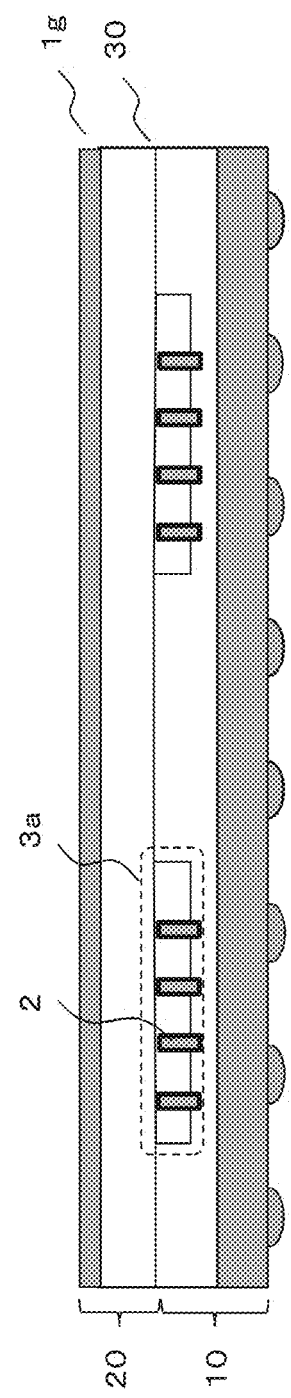

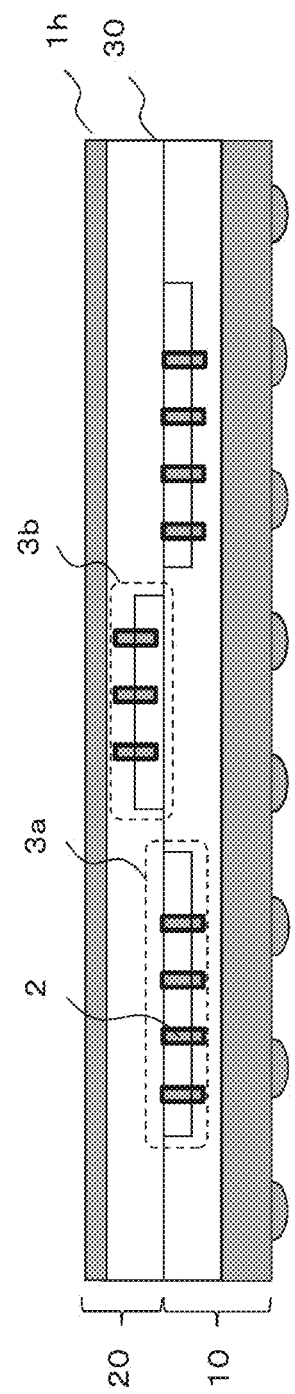

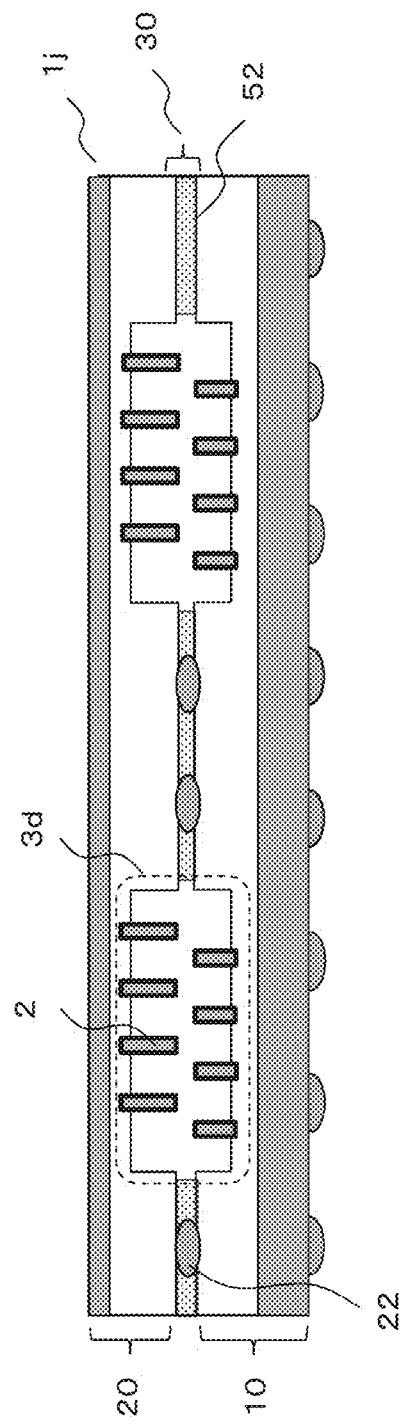

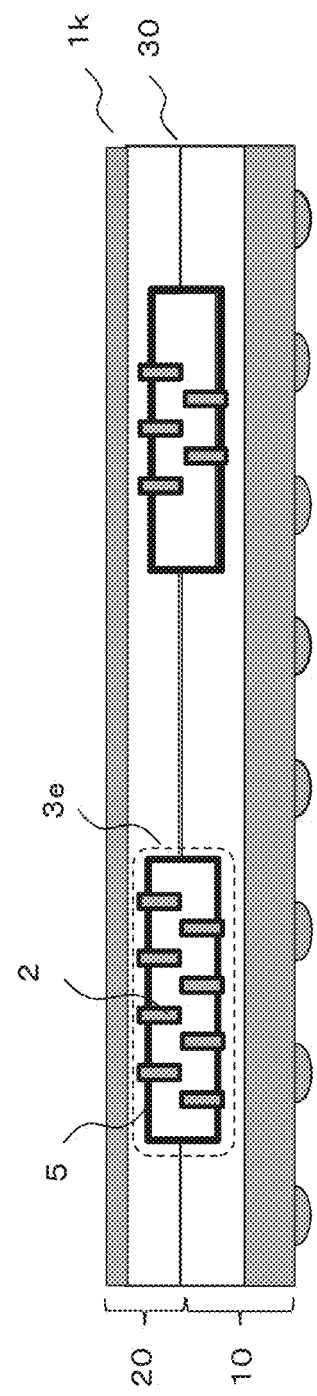

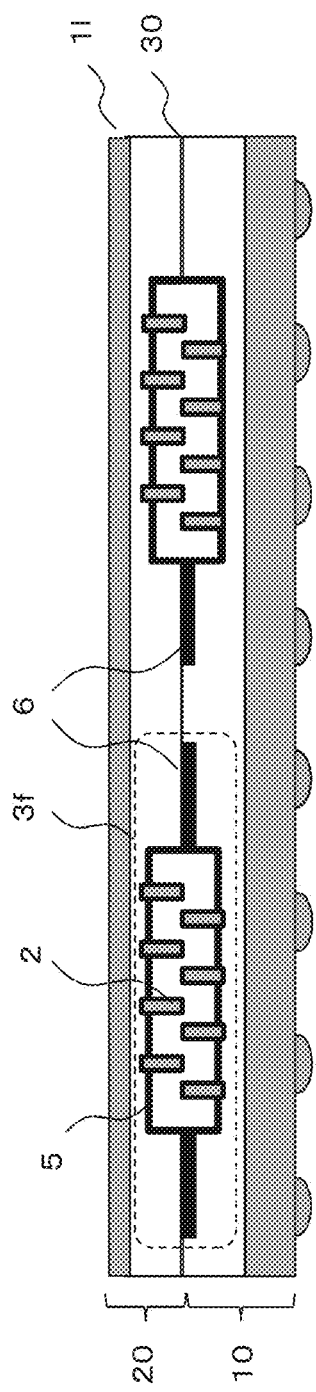

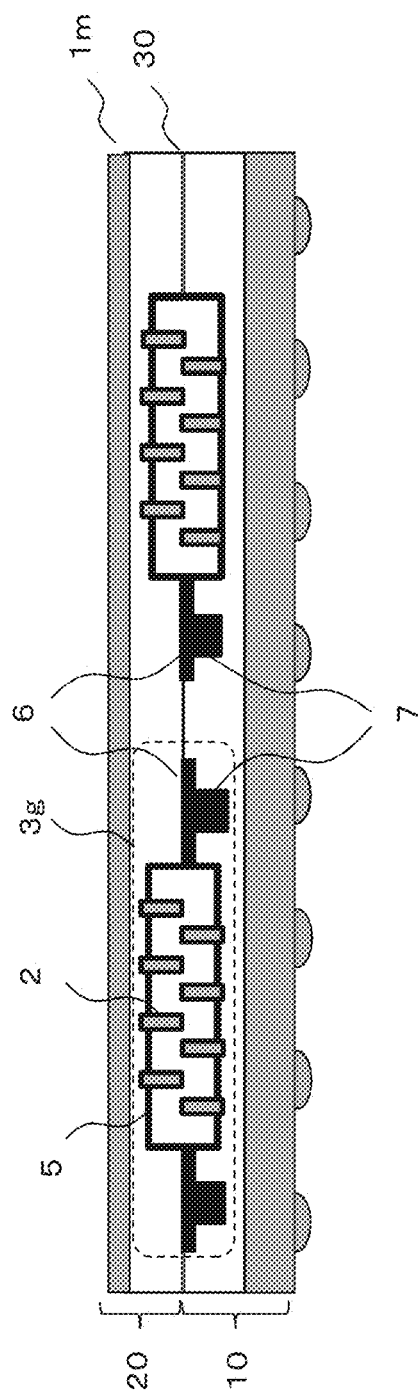

ELECTRONIC COMPONENT AND ELECTRONIC COMPONENT COOLING METHOD

INCORPORATION BY REFERENCE

This application is based upon and claims the benefit of priority from Japanese Patent Application No. 2013-044255, filed on Mar. 6, 2013, the disclosure of which is incorporated herein in its entirety by reference.

TECHNICAL FIELD

The present invention relates to an electronic component and an electronic component cooling method capable of effectively radiating heat which the electronic component internally generates and producing a cooling effect.

BACKGROUND ART

Refining (i.e. scaling) of semiconductor devices has been progressed in accordance with Moore's Law in which integration density becomes double every 18-24 months. So far, in accordance with Moore's Law, with the progress of the refining, higher integration, superior performance, sophisticated function-ization and cost reduction have been realized. However, recently, to follow to Moore's Law is approaching to an upper limit both from a technological aspect and an economical aspect.

In recent years, a new movement of transcending Moore's Law has been started. This movement is also called MtM (More than Moore), and an intention is not only refining of a semiconductor devices but also higher integration and denser packaging of electronic components. Useful technologies include three dimensions layering technology using TSV (Through Silicon Via) and SiP (System in Package) technology.

Following to the movement, refining, higher integration and denser packaging of electronic components including semiconductor devices are enhancing. On the other hand, because of the movement, heat density of electronic components is increasing. Consequently, efficient cooling of electronic components is required more than ever.

Japanese Patent Application Laid-Open No. 2010-153799 (hereinafter referred to as "patent literature 1") disclosed a semiconductor structure equipped with a dielectric layer including a continuous cavity between two semiconductor substrates. The technology disclosed in the patent literature 1 is the technology to cool the continuous cavity equipped in the dielectric layer by flowing a cooling medium as a cooling channel.

Japanese Patent Application Laid-Open No. 2012-138473 (hereinafter referred to as "patent literature 2") disclosed a package structure to put on a cover having an input port and output port for a cooling medium on an interposer (i.e. conversion substrate) equipped with semiconductor devices or electronic components (hereinafter it simply denotes as "electronic component" instead of classifying between semiconductor device and electronic component). The technology disclosed in the patent literature 2 is a technology to cool the surface of the electronic components mounted on the interposer by flowing the cooling medium in an internal space composed of the interposer and the cover.

SUMMARY

An object of the present invention is to provide an electronic component and an electronic component cooling method capable of effectively radiating heat that the electronic component internally generates and producing a cooling effect.

An electronic component according to the present invention is characterized by including a base substance, a cooling channel formed in the base substance and flows a cooling medium in a second direction from a first direction and a radiator formed in a surface of the cooling channel using a material of which thermal conductivity is higher than a thermal conductivity of the base substance or formed so that the radiator may project to the cooling channel, and that contacts the cooling medium.

Electronic component cooling method of the present invention is characterized by flowing a cooling medium in a second direction from a first direction of a cooling channel so that the cooling medium may contact a radiator formed in the cooling channel in a base substance of the electronic components using a material of which thermal conductivity is higher than a thermal conductivity of the base substance, or a radiator formed so as to project to the cooling channel in the base substance.

BRIEF DESCRIPTION OF THE DRAWINGS

Exemplary features and advantages of the present invention will become apparent from the following detailed description when taken with the accompanying drawings in which:

FIG. 7 shows a sectional view of an electronic component according to the third exemplary embodiment of the present invention;

FIG. 8 shows a sectional view of a laminated electronic component of the electronic component according to the third exemplary embodiment of the present invention;

FIG. 9 shows a sectional view of an electronic component according to the fourth exemplary embodiment of the present invention;

FIG. 10 shows a sectional view of an electronic component according to the fifth exemplary embodiment of the present invention;

FIG. 12 shows a sectional view of an electronic component according to the seventh exemplary embodiment of the present invention;

FIG. 13 shows a sectional view of an electronic component according to the eighth exemplary embodiment of the present invention;

FIG. 14 shows a sectional view of an electronic component according to the ninth exemplary embodiment of the present invention; and FIG. 15 shows a sectional view of an electronic component according to the tenth exemplary embodiment of the present invention.

EXEMPLARY EMBODIMENT

Exemplary embodiments of the present invention will now be described in detail in accordance with the accompanying drawings.

First Exemplary Embodiment

Figure 1:
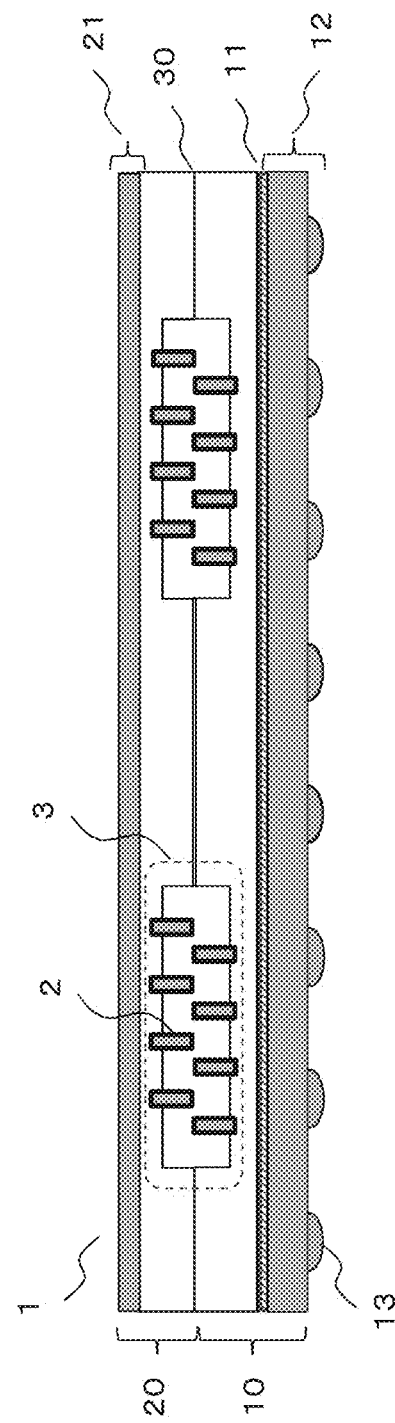
FIG. 1 shows a sectional view of an electronic component according to the first exemplary embodiment of the present invention.

The first exemplary embodiment of the present invention is explained. FIG. 1 shows the sectional view of an electronic component 1 according to the first exemplary embodiment of the present invention.

A configuration of the electronic component 1 is explained with reference to FIG. 1. The electronic component 1 includes a semiconductor substrate 10 and a semiconductor substrate 20. The semiconductor substrate 10 includes an element layer 11 on which elements including transistors are formed, a wiring layer 12 and a connecting bump 13. The semiconductor substrate 20 includes a wiring layer 21.

Further, the semiconductor substrate 10 includes a groove formed by etching or the like and has a concave-shaped space, and a projecting part on which copper plating or the like is performed and which is formed at a bottom of the concave-shaped part. In the exemplary embodiment, the projecting part formed at the bottom of the concave-shaped part is denoted "radiator", and a concave-shaped space equipped with the radiator is denoted "cooling channel".

A semiconductor substrate 20 includes, as is similar to the semiconductor substrate 10, a concave-shaped space (i.e. cooling channel) formed by etching or the like and a projecting part (i.e. radiator) formed at the bottom of the concave-shaped part, and is plated.

The electronic component 1 has a joined structure in which the concave-shaped space of the semiconductor substrate 10 faces with the concave-shaped space of the semiconductor substrate 20, and the semiconductor substrate 10 and the semiconductor substrate 20 are directly joined at a junction part 30. By the joint, a cooling channel 3 equipped with the radiator 2 is formed at the junction part 30 of the electronic component 1.

In the electronic component 1, the semiconductor substrate 10 is electrically connected with the semiconductor substrate 20 using TSV technology (not shown in the figure).

The electronic component 1 generates heat by heat sources including mainly the element layer 11 and the wiring layer 12 of the semiconductor substrate 10, and the wiring layer 21 and the junction part 30 of the semiconductor substrate 20. The heat generated by the heat sources inside of the electronic component 1 is transferred to the radiator 2 and an inner wall of the cooling channel 3 by heat transfer.

The cooling channel 3 of the electronic component 1 can flow the cooling medium. For example, the cooling channel 3 has a structure in which the cooling medium can be flowed from a front side to a backside in a vertical direction of a paper surface. The electronic component 1, by flowing the cooling medium in the cooling channel 3, can efficiently transfer heat generated inside of the electronic component 1 from the radiator 2 and the inner wall of the cooling channel 3 having the radiator 2 to the cooling medium which flows in the cooling channel 3, and can radiate the heat.

Therefore, in the exemplary embodiment, the electronic component 1 is possible to effectively radiate heat generated inside of the electronic component, and produce a cooling effect.

Incidentally, in the exemplary embodiment, although it has described that copper plating is performed on the radiator equipped at a cooling channel, a plating material of the radiator is not limited to copper. For example, aluminum can be used for the plating material of the radiator. In addition, the radiator can be formed with the plating material. That is, concerning the plating material used for the radiator, because the plating material used for the radiator should have higher thermal conductivity than a semiconductor material such as silicon or germanium and the plating material used for the radiator can be formed by projecting at the bottom part of the cooling channel, copper or aluminum or the like can be used as the material of the radiator.

In addition, in the exemplary embodiment, although it has described that the shape of the radiator equipped in the cooling channel should be the projecting part, the shape of the radiator can be plate-shaped one, fin-shaped one, column-shaped one or a shape like a spiked holder. That is, all the radiator according to the present invention has to do is not to interrupt the cooling medium which flows in the cooling channel and to radiate as the radiator by contacting with the cooling medium. There is no limitation on the shape of the radiator.

In addition, in the exemplary embodiment, although it has described that four radiators are equipped on the cooling channel, there is no limitation on the number of the radiators. For example, the number of the radiators can be less than or equal to four, or equal to or more than five. In addition, the number of the radiators equipped at an upper part of the cooling channel may differ from the number of the radiators equipped at a lower part of the cooling channel. That is, the radiator has only to be equipped at the upper part or the lower part of the cooling channel and radiate heat to the cooling medium as the radiator. There is no limitation on the number of the radiators at the upper part and the lower part of the cooling channel.

In the exemplary embodiment, although it has described that the cooling channel is formed in the concave-shaped space, there is no limitation on the cross-sectional shape of the cooling channel. For example, although the section of the cooling channel is illustrated in a rectangle form, the section of the cooling channel can have semicylinder-shaped. That is, the cooling channel has only to have the radiator, and the inflow port and the outflow port which can flow the cooling medium. There is no limitation on the cross-sectional shape of the cooling channel.

In the exemplary embodiment, although two cooling channels are illustrated and described, the number of the cooling channels is not limited to two. For example, the number of the cooling channels can be one, or equal to or more than three. In addition, the structure of the cooling channel can be a structure which has two inflow ports and one outflow port for the cooling channels. That is, the cooling channel has only to flow the cooling medium. There is no limitation on the number of the cooling channels and the number of the inflow ports and the outflow ports.

In the exemplary embodiment, it has described that the electronic component 1 is the electronic component in which the semiconductor substrate 10 and the semiconductor substrate 20 are directly connected at the junction part 30 and the electronic component 1 is electrically joined via TSV. The semiconductor substrate 10 does not have to be electrically connected with the semiconductor substrate 20. For example, the wiring layer 12 of the semiconductor substrate 10 does not have to be electrically connected with the wiring layer 21 of the semiconductor substrate 20. In addition, the wiring layer 21 does not have to be formed on the semiconductor substrate 20.

Although it has described that the semiconductor substrate 10 includes the connecting bump 13, lead terminal or leadless terminal can be equipped instead of the connecting bump 13. Alternatively, the electronic component 1 can be connected with exterior by electromagnetic means such as optics or wireless.

It can assume that the heat source of the electronic component 1 is mainly the element layer 11 of the semiconductor substrate 10. The electronic component 1 does not have to include the element layer 11 nor the wiring layer 12, and the heat sources of the electronic component 1 can be mainly other parts in the electronic component 1.

That is, the electronic component 1 has only to receive and transfer heat which the heat sources generates, and transfer the heat to the radiator and the cooling channel equipped with the radiator, and radiate to the cooling medium which flows in the cooling channel. There is no limitation on an electric connection structure and an electric element structure of the electronic component 1.

Figure 6A:
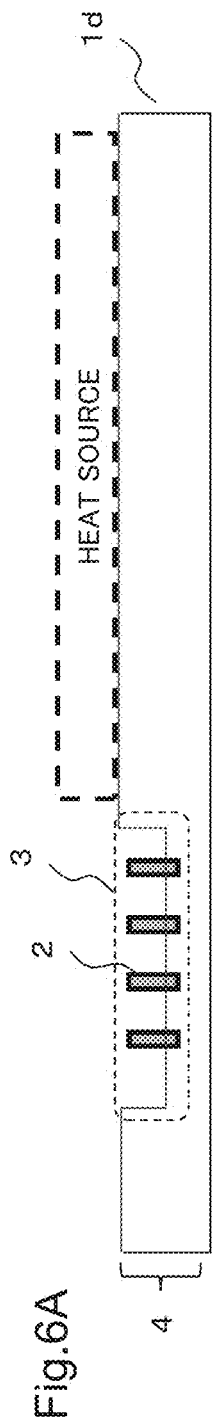
FIG. 6A shows a sectional view of an electronic component according to the second exemplary embodiment of the present invention.
Figure 6B:
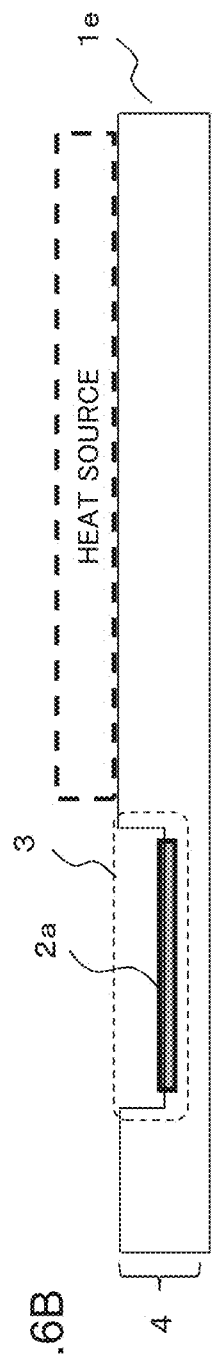
FIG. 6B shows a sectional view of another electronic component according to the second exemplary embodiment of the present invention.

In the exemplary embodiment, although it has described that the cooling channel is formed at the joining part in which the semiconductor substrate 10 and the semiconductor substrate 20 of the electronic component 1 are directly joined at the junction part 30, the cooling channel does not need to be formed at the joining part of two semiconductor substrates. For example, the cooling channel can be formed at a surface of one of the semiconductor substrates. FIG. 6A and FIG. 6B illustrate minimum configurations according to the exemplary embodiment of the present invention, and will be described later as the second exemplary embodiment.

Figure 2:
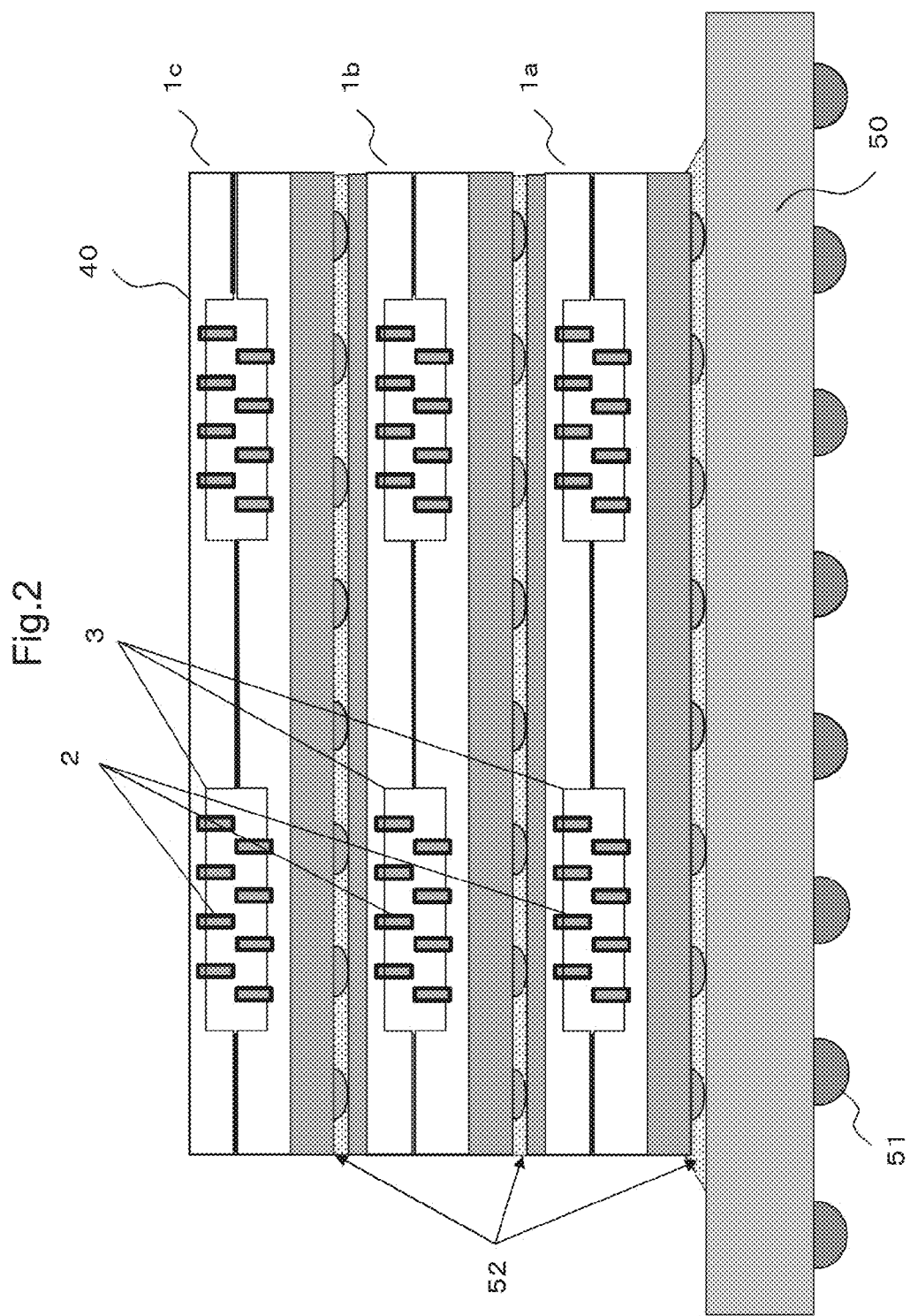
FIG. 2 shows a sectional view of a laminated electronic component of the electronic component according to the first exemplary embodiment of the present invention.

FIG. 2 shows the sectional view of the laminated electronic component according to the first exemplary embodiment. The configuration of a laminated electronic component 40 is explained with reference to FIG. 2.

The laminated electronic component 40 is the electronic component on which a plurality of the electronic components 1 shown in FIG. 1 are laminated. Specifically, on the laminated electronic component 40, an interposer 50 equipped with the connecting bumps 51 and a wiring layer (not shown in the diagram), and electronic components 1a, 1b and 1c which are electrically connected with the interposer 50, are laminated.

That is, the interposer 50 and the electronic component 1a, the electronic component 1a and the electronic component 1b, and the electronic component 1b and the electronic component 1c are electrically connected by a respectively connection terminal (not shown in the diagram), connection bumps and TSV (not shown in the diagram). An underfill 52 is filled into a gap between the interposer 50 and the electronic component, and gaps between respective electronic components.

The laminated electronic component 40 includes a structure in which each of the electronic component 1 having the cooling channel 3 equipped with the radiator 2 are laminated. The laminated electronic component 40, by flowing the cooling medium in the cooling channel 3 of a laminated electronic component 1, can transfer heat generated inside of the laminated electronic component 40 to the cooling medium which flows in the cooling channel 3 equipped with the radiator 2, and efficiently radiate the heat.

Therefore, the laminated electronic component can effectively radiate heat generated inside of the laminated electronic component, and produce a cooling effect.

Incidentally, in the exemplary embodiment, although it has described that the laminated electronic component in FIG. 1 is a component in which three tiers of electronic component 1 respectively equipped with the cooling channel are laminated and electrically connected via TSV, a structure of the electronic component is not limited to this configuration. For example, the laminated electronic component can mix electronic component which does not equip with the cooling channel for the electronic component to be laminated, and the number of tiers of the lamination can be less than or equal to two or equal to or more than four. In addition, the laminated electronic component can include electronic components connected with the interposer or other electronic component by a wire bonding, or can include the electronic component directly mounted on the interposer instead of laminated. In addition, although it has described that the interposer equips with connecting bumps, lead terminals or leadless terminals can be equipped instead of the connecting bumps. Alternatively, the laminated electronic component can be connected with exterior by electromagnetic means including optics or wireless.

That is, the laminated electronic component has only to include the electronic component having the cooling channel equipped with the radiator. There is no limitation on the number of tires of the lamination and the electric connection structure.

Figure 3:
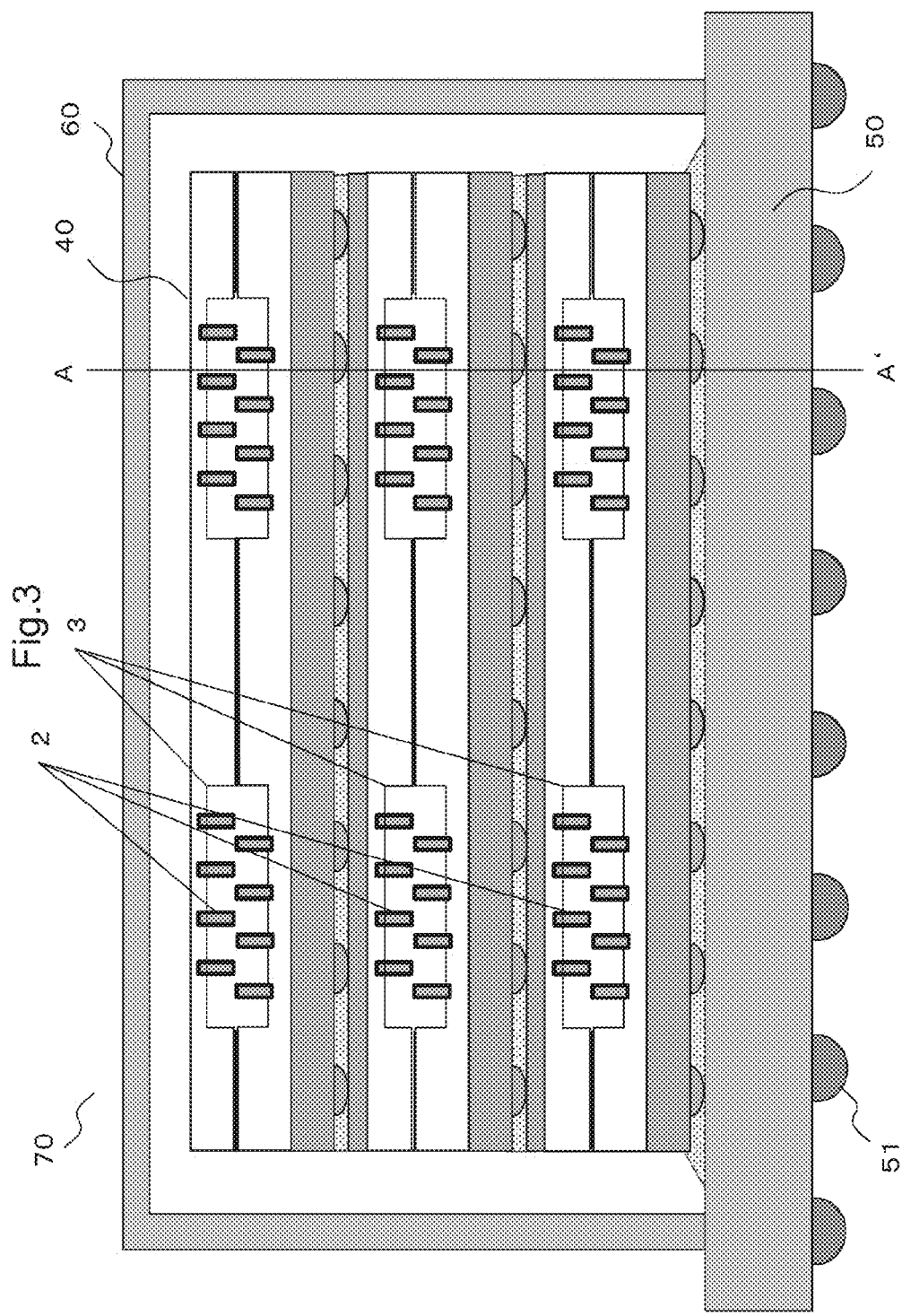
FIG. 3 shows a sectional view of an electronic components module according to the first exemplary embodiment of the present invention.

FIG. 3 shows the sectional view of the electronic components module according to the first exemplary embodiment. An electronic components module 70 with the built-in laminated electronic component 40 according to the exemplary embodiment is explained with reference to FIG. 3.

FIG. 3 shows the sectional view of the cooling channel 3 equipped in the laminated electronic component 40 when cutting at a vertical direction to a direction in which the cooling medium flows. The electronic components module 70 includes a lid 60 attached to the interposer 50 so that the laminated electronic component 40 described in FIG. 2 will be covered.

Figure 4:
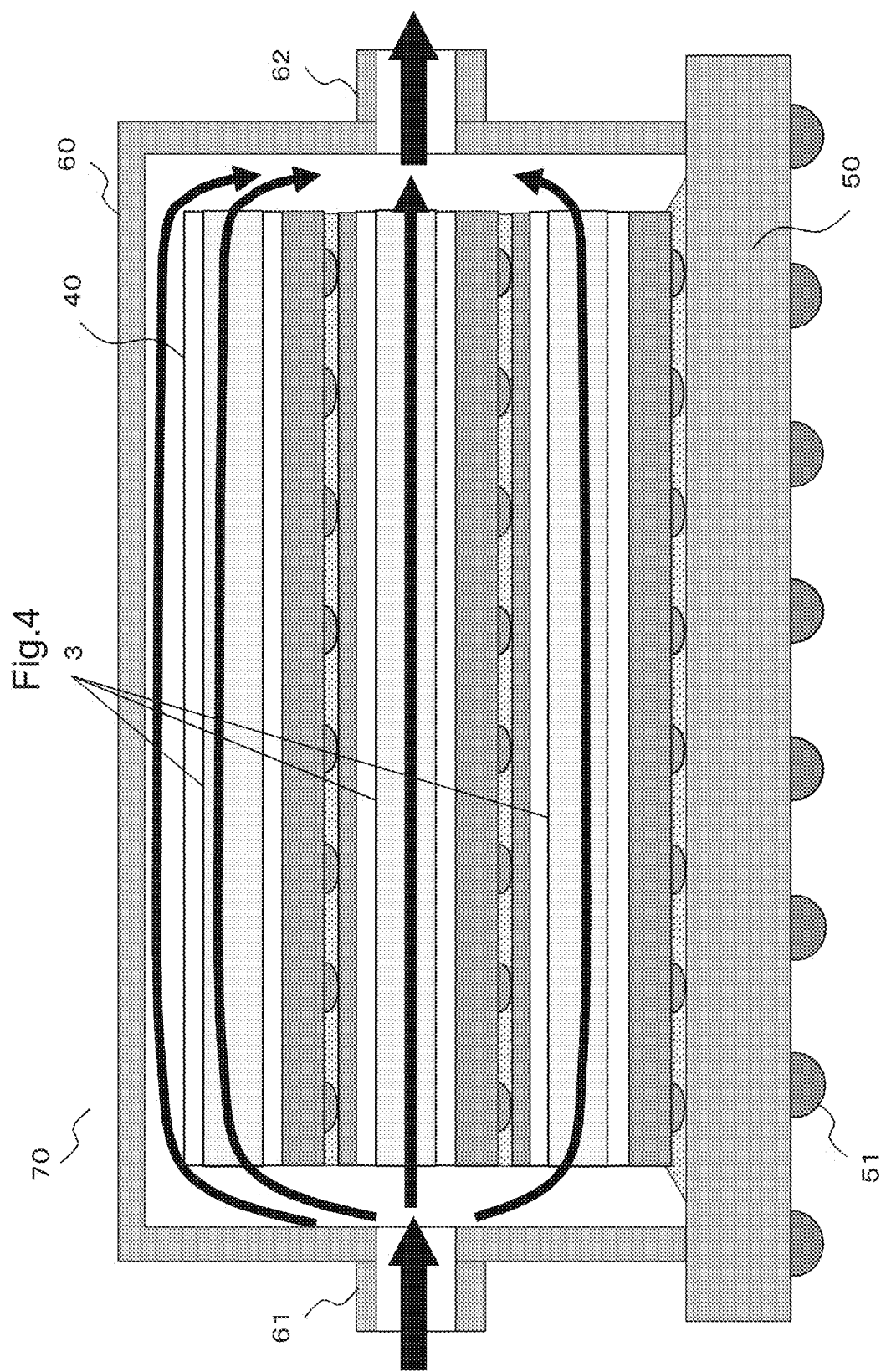
FIG. 4 shows a sectional view of the electronic components module according to the first exemplary embodiment of the present invention.

FIG. 4 shows the sectional view of the electronic components module 70 according to the first exemplary embodiment. The electronic components module 70 is explained with reference to FIG. 4. FIG. 4 shows the sectional view showing the section by cutting the electronic components module 70 described in FIG. 3 in a vertical direction including line A-A' of the paper surface in FIG. 3. The lid 60 includes an inflow port 61 and an outflow port 62 for the cooling medium.

In order to cool the laminated electronic component 40, the cooling medium is flowed into the lid 60 from the inflow port 61 of the cooling medium. The flowed cooling medium flows in the cooling channels 3 equipped in the laminated electronic component 40 and also in a gap between the lid 60 and the laminated electronic component 40, and then flows out from the outflow port 62 for the cooling medium. Arrows in FIG. 4 indicate flows of the cooling medium.

Therefore, the electronic components module 70 includes the lid 60 which covers the laminated electronic component 40 including the cooling channels 3 equped with the radiators 2. Because the electronic components module 70 is covered with the lid 60, the cooling medium for radiating heat generated in the laminated electronic component 40 flows inside of the lid 60. The electronic components module 70 can flow the cooling medium in the cooling channel 3 equipped in the electronic component 1 laminated as the laminated electronic component 40. That is, the electronic components module 70 can efficiently transfer heat generated inside of the laminated electronic component 40 to the cooling medium which flows in the cooling channel 3 equipped with a radiator 2, and can radiate to outside of the lid 60.

Therefore, the electronic components module can effectively radiate heat generated inside of the electronic component located in the lid, and produce a cooling effect.

Incidentally, in the exemplary embodiment, if a lid is made of metal, the lid is soldered or brazed with a metal part equipped on a surface of the interposer. Further, if the lid is made of resin or if there are no metal parts for attaching the lid on the surface of the interposer, the lid can be adhered to the surface of the interposer by adhesive agent. Furthermore, in the exemplary embodiment, although it has illustrated and described that the lid is fixed on the surface of the interposer, the lid does not necessarily need to be fixed on the surface of the interposer. For example, the lid has a cube-shaped with hollow structure, and the laminated electronic component mounted on the interposer or the electronic component which is not mounted on the interposer can be fixed on internal surfaces of the lid. That is, the lid has only to include the inflow port and the outflow port for the cooling medium and be capable to flow the cooling medium inside of the lid. There is no limitation on a material of the lid and a fixation method of the electronic components including the laminated electronic component with the lid.

In addition, in the exemplary embodiment, although it has illustrated and described that the number of the inflow ports and the outflow ports for the cooling medium equipped at the lid is respectively set to one, there is no limitation on the number of the inflow ports and the outflow ports. That is, the lid has only to include the inflow port and the outflow port for the cooling medium and be capable to flow the cooling medium inside of the lid. There is no limitation on the number of the inflow ports and the outflow ports equipped with the lid.

Figure 5:
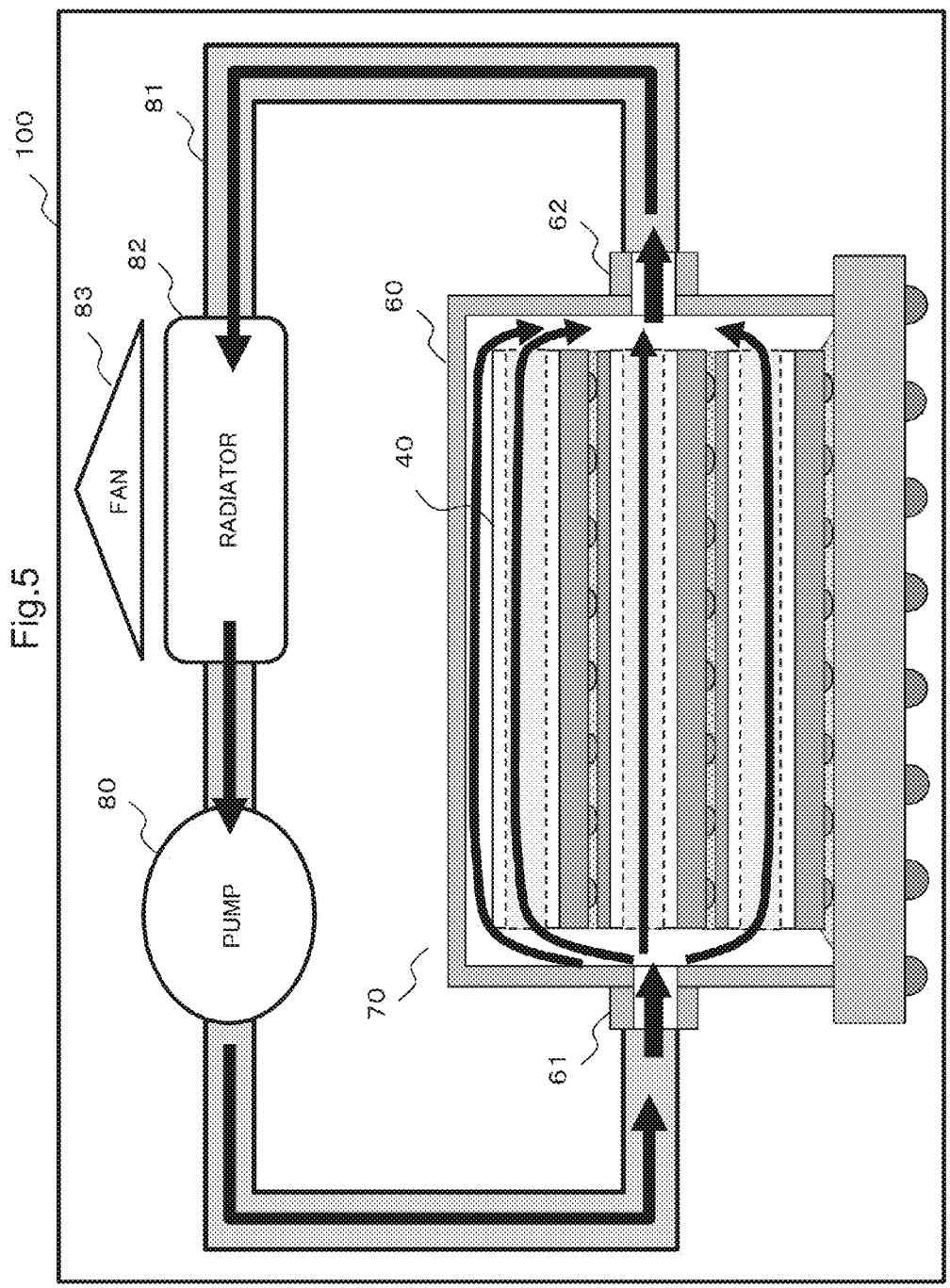
FIG. 5 shows a cooling system diagram of the electronic components module according to the first exemplary embodiment of the present invention.

FIG. 5 shows the cooling system diagram of the electronic components module according to the first exemplary embodiment. A cooling system 100 is explained with reference to FIG. 5. The cooling system 100 includes the electronic components module 70, a pump 80, a pipe 81, a radiator 82 and a fan 83.

The pipe 81 connects the inflow port 61 for the cooling medium of the electronic components module 70 with the pump 80, the outflow port 62 for the cooling medium of the electronic components module 70 with the radiator 82, and the pump 80 with the radiator 82. The pump 80 circulates the cooling medium as is shown by arrows. The radiator 82 cools the cooling medium is heated by heat generated inside of the laminated electronic component 40. The fan 83 blows air streams to the radiator 82 and enhances cooling of the cooling medium inside of the radiator 82.

As described above, the cooling system 100 flows the cooling medium in the electronic components module 70 having the built-in laminated electronic component 40, and takes out heat generated inside of the laminated electronic component 40. In addition, the cooling medium heated by heat generated inside of the laminated electronic component 40 is cooled by the radiator 82 and the fan 83, and is flowed again into the electronic components module 70 by the pump 80. That is, the cooling system 100 can cool inside of the electronic components module 70 by circulating the cooling medium between the electronic components module 70 and the radiator 82 by the pump 80.

The cooling system 100 flows the cooling medium in the cooling channel 3 equipped in the electronic component 1 laminated as the laminated electronic component 40 built-in in the electronic components module 70. That is, the cooling system 100 can efficiently transfer heat generated inside of the laminated electronic component 40 to the cooling medium which flows in the cooling channel 3 equipped with a radiator 2, and can efficiently radiate the cooling medium by the radiator 82.

Therefore, the cooling system can effectively radiate heat generated inside of the electronic component built-in electronic components module, and produce a cooling effect.

Incidentally, in the exemplary embodiment, although it has described that the cooling system has fans, there is no limitation on whether the cooling system has the fans or not. For example, if the radiator equipped in the cooling system does not have fans and can sufficiently radiate heat of the cooling medium, the cooling system does not need to have the fans. In addition, in the exemplary embodiment, although it has described that the cooling system has the radiator, there is no limitation on whether the cooling system has the radiator or not. For example, if a pipe equipped in the cooling system can sufficiently radiate heat of the cooling medium to outside air, the cooling system does not need to have the radiator.

That is, the cooling system does not need to include the radiator nor a fan, and also does not need to have a special cooling device if heat of the cooling medium can be sufficiently radiated.

In addition, the pipe according to the exemplary embodiment can be made of metal or resin. That is, the pipe of the cooling system has only to be able to flow the cooling medium between the pump and the electronic components module. There is no limitation on material of the pipe.

As described above, in the first exemplary embodiment of the present invention, the electronic component, the laminated electronic component, the electronic components module and the cooling system can efficiently transfer heat generated inside of the electronic component to the cooling medium which flows in the cooling channel equipped with the radiator, and can radiate the heat. That is, the electronic component, the laminated electronic component, the electronic components module and the cooling system can effectively radiate heat generated inside of the electronic component, and produce a cooling effect.

Second Exemplary Embodiment

The second exemplary embodiment of the present invention is explained. FIG. 6A is the sectional view of an electronic component 1d according to the second exemplary embodiment of the present invention, and is the figure illustrating a minimum configuration of the present invention. FIG. 6B is the sectional view of another exemplary configuration of the electronic component 1d according to the second exemplary embodiment of the present invention.

The electronic component 1d according to the exemplary embodiment is explained with reference to FIG. 6A. The cooling channel 3 equipped with the radiators 2 is formed at a base substance 4 of the electronic component 1d. The radiator 2 and the cooling channel 3 are the same as the radiator 2 and the cooling channel 3 described in FIG. 1, and the descriptions are omitted.

For the electronic component 1d, the heat sources contact with an upper surface of the base substance 4. Then, heat which the heat sources generate heat transfers to the base substance 4. The transferred heat is transferred to the radiator 2 and the inner wall of the cooling channel 3 equipped with the radiator 2 after transferred innards of the base substance 4 of the electronic component 1d.

The cooling channel 3 can flow the cooling medium. For example, the cooling channel 3 has a structure in which the cooling medium can be flowed from the front side to the backside in a vertical direction of the paper surface. The electronic component 1d can, by flowing the cooling medium in the cooling channel 3, efficiently transfer heat generated by the heat sources that contact with the electronic component 1d, from the radiator 2 and the inner wall of the cooling channel 3 to the cooling medium which flows in the cooling channel 3, and can radiate the heat.

Therefore, the electronic component can effectively radiate heat generated by the heat sources with which the electronic component contacts, and produce a cooling effect.

An electronic component 1e according to the exemplary embodiment is explained with reference to FIG. 6B. A difference between the radiator 2a equipped on the electronic component 1e and the radiator 2 of the electronic component 1d described in FIG. 6A is in a point of their shapes. Therefore, the elements in FIG. 6B are assigned the same reference numbers as those of the same elements in FIG. 6A, and the descriptions are omitted.

A radiator 2a equipped in the electronic component 1e is formed in plate-shaped at a bottom part of the cooling channel 3. Similar to the radiator 2 equipped in the electronic component 1d, the radiator 2a contacts with the cooling medium which flows in the cooling channel 3. Therefore, similar to the electronic component 1d, the electronic component 1e can efficiently transfer heat generated by the heat sources from the radiator 2a and the inner wall of the cooling channel 3 to the cooling medium which flows in the cooling channel 3, and can radiate the heat. Incidentally, in the exemplary embodiment, although it has described that the heat sources contact the electronic component at a top surface of the electronic component, the contact position of the heat sources with the electronic component is not limited to this case. For example, the heat sources can contact the electronic component at a bottom surface of the electronic component. Further, the heat sources can be embedded inside of the electronic component and internally contact with the electronic component. Furthermore, heat from the heat sources can be transferred to the electronic component as radiated heat.

That is, the electronic component has only to receive heat which the heat sources generated and transfer the heat to the cooling channel which is formed on a base substance and equipped with the radiator. There is no limitation on a contacted part between the heat sources and the electronic component and also a heat transferring method for transferring from the heat sources.

For the electronic component according to the exemplary embodiment, there is no limitation on the electric connection structure nor the electric element structure including such as the element layer of transistors, the wiring layer which wires among the elements, TSV for connecting the front side and the back side of the base substance, and the connecting bumps, the lead terminals and the leadless terminals for connecting with other electronic components. The electronic component can equip with these electric connection structures and electric element structures, or does not need to equip with all of these electric connection structures and electric element structures. In addition, the materials of the base substance of the electronic component can be a semiconductor material such as silicon or germanium, or a metallic material or a resin material.

That is, the electronic component has only to receive heat which the heat sources generated and transfer the heat to the cooling channel which is formed on the base substance and equipped with the radiator. There is no limitation on the electric connection structures, the electric element structure and the material of the base substance of the electronic component.

Third Exemplary Embodiment

The third exemplary embodiment of the present invention is explained. FIG. 7 shows the sectional view of an electronic component 1f according to the third exemplary embodiment of the present invention. The electronic component 1f according to the exemplary embodiment is explained with reference to FIG. 7.

For the electronic component 1f, the cooling channel 3 equipped with the radiator 2 is formed on the semiconductor substrate 10. The radiator 2 and the cooling channel 3 are the same as the radiator 2 and the cooling channel 3 described in FIG. 1, and the descriptions are omitted.

The electronic component 1f includes the element layer 11 in which elements including transistors or the like are formed on the semiconductor substrate 10, the wiring layer 14 and a wiring layer 15 including the connection bumps 16. The wiring layer 14 is electrically connected with the wiring layer 15 by TSV (not shown in the diagram). The electronic component 1f generates heat by heat sources including mainly the element layer 11, the wiring layer 14 and the wiring layer 15. Heat generated by the heat sources inside of the electronic component 1f is heat transferred to the radiator 2 and the inner wall of the cooling channel 3. The cooling channel 3 can flow the cooling medium. For example, the cooling channel 3 has a structure in which the cooling medium can be flowed from the front side to the back side in a vertical direction to the paper surface. The electronic component 1f can, by flowing the cooling medium in the cooling channel 3, efficiently transfer heat generated at inside of the electronic component 1f from the radiator 2 and the inner wall of the cooling channel 3 to the cooling medium which flows in the cooling channel 3, and can radiate the heat.

Therefore, the electronic component can effectively radiate heat generated inside of the electronic component, and produce a cooling effect.

FIG. 8 shows the sectional view of the laminated electronic component according to the third exemplary embodiment. A laminated electronic component 41 is explained with reference to FIG. 8.

The laminated electronic component 41 is the electronic component in which the electronic components if described in FIG. 7 are laminated in two-tiers. Specifically, for the laminated electronic component 41, the interposer 50 equipped with the connecting bumps 51 and the wiring layer (not shown in the diagram), and two electronic components 1f electrically connected with the interposer 50, are laminated in two-tiers.

That is, the interposer 50 and lower tier of the electronic component 1f and also lower tier of the electronic component 1f and upper tier of the electronic component 1f are electrically connected by respective connection terminals (not shown in the diagram), the connection bumps 16 and TSV (not shown in the diagram). The underfill 52 is filled into a gap between the interposer 50 and the electronic component and a gap between the electronic components.

The laminated electronic component 41 has a structure in which the electronic components 1f equipped with the cooling channel 3 on which the radiator 2 is formed are laminated. The laminated electronic component 41 can, by flowing the cooling medium in each cooling channels 3 of each of the laminated electronic components 1f, transfer heat generated inside of the laminated electronic component 41 to the cooling medium which flows in the cooling channels 3 equipped with the radiators 2, and can efficiently radiate the heat.

Therefore, the laminated electronic component according to the exemplary embodiment can effectively radiate heat generated inside of the laminated electronic components, and produce a cooling effect.

Incidentally, in the exemplary embodiment, although the laminated electronic component is described by illustrating that the laminated electronic component is the component consisting of two-tiers of the electronic components equipped with the cooling channel on each of them and electrically connected via TSV as shown in the FIG. 7, there is no limitation on the structure of the electronic component. For example, the laminated electronic component can mix with the electronic component without the cooling channel. The number of tiers of the lamination can be one, or equal to or more than three. In addition, the laminated electronic component can include those electronic components connected with the interposer or other electronic components by wire bonding. In addition, although it has described that the interposer includes the connecting bumps, lead terminals or leadless terminals can be equipped instead of the connecting bumps. Alternatively, the laminated electronic component can be connected with exterior by electromagnetic means including optics or wireless.

That is, the laminated electronic component has only to include the electronic component having the cooling channel equipped with the radiator. There is no limitation on the number of tiers of the lamination and the electric connection structure of the laminated electronic component.

Fourth Exemplary Embodiment

The fourth exemplary embodiment of the present invention is explained. FIG. 9 shows the sectional view of an electronic component 1g according to the fourth exemplary embodiment of the present invention. The electronic component 1g according to the exemplary embodiment is explained with reference to FIG. 9.

The exemplary embodiment is different from the first exemplary embodiment on a point that a cooling channel 3a is equipped only at a side of the semiconductor substrate 10. Therefore, the elements of the electronic component 1g are assigned the same reference numbers as those of the same elements of the first exemplary embodiment, and the descriptions are omitted.

In the exemplary embodiment, because the cooling channel 3a is formed only at the side of the semiconductor substrate 10, a cross-sectional area of the cooling channel becomes small as compared with the first exemplary embodiment. Therefore, the cooling efficiency in the exemplary embodiment becomes small as compared with the first exemplary embodiment, because the contact area between the cooling channel having the radiator and the cooling medium becomes small and also amount of inflow of the cooling medium becomes little. However, the number of manufacturing steps of the electronic component 1g can be reduced.

Therefore, in the exemplary embodiment, an effect of cost cutting can be produced by reduction in the number of manufacturing steps.

Incidentally, in the exemplary embodiment, although it has described that the cooling channel was equipped only at the side of the semiconductor substrate 10, the cooling channel can be equipped only at a side of the semiconductor substrate 20.

Fifth Exemplary Embodiment

The fifth exemplary embodiment of the present invention is explained. FIG. 10 is the sectional view of an electronic component 1h according to the fifth exemplary embodiment of the present invention. The electronic component 1h according to the exemplary embodiment is explained with reference to FIG. 10.

The exemplary embodiment is different from the first exemplary embodiment on a point that the cooling channel 3a equipped on the semiconductor substrate 10 and the cooling channel 3b equipped on the semiconductor substrate 20 do not face each other. Therefore, the elements of the electronic component 1h are assigned the same reference numbers as those of the same elements of the first exemplary embodiment, and the descriptions are omitted.

In the exemplary embodiment, the cooling channel 3a equipped at side of the semiconductor substrate 10 and a cooling channel 3b equipped at side of the semiconductor substrate 20 do not face each other. Therefore, when compared with the first exemplary embodiment, a flexibility of a design of the semiconductor substrate 10 and the semiconductor substrate 20 can be enhanced. Further, because the cooling channel 3a at side of the semiconductor substrate 10 need not be combined with the cooling channel 3b at side of the semiconductor substrate 20 into one cooling channel, high accuracy of the joint of the semiconductor substrate 10 and the semiconductor substrate 20 is not necessary.

Therefore, because the electronic component 1h can keep a cross-sectional area of the cooling channel at comparable level as that one according to the first exemplary embodiment, a similar cooling effect as that one according to the first exemplary embodiment can be produced. Further, the structure of the electronic component 1h can reduce a design term by an improvement on flexibility of design of the electronic component 1h. Then, the structure of the electronic component 1h can reduce a term of manufacturing steps by precision easing in manufacturing steps. That is, the structure of the electronic component 1h can produce an effect of cost cutting through shortening of these terms.

Incidentally, in the exemplary embodiment, although the exemplary embodiment has described by illustrating that two cooling channels 3a are formed at side of the semiconductor substrate 10 and one cooling channel 3b is formed at side of the semiconductor substrate 20, there is no limitation on the number of the cooling channels formed on each of the semiconductor substrate. For example, three cooling channels can be formed at the semiconductor substrate of the upper tier and two cooling channels can be formed at the semiconductor substrate of the lower tier. In addition, the structure of the cooling channel can have a structure which has two inflow ports and one outflow port for the cooling channel. That is, the cooling channel should be so that the cooling medium can flow inside of the cooling channel, and there is no limitation on the number of the cooling channels or the number of the inflow ports and the outflow ports.

Sixth Exemplary Embodiment

Figure 11:
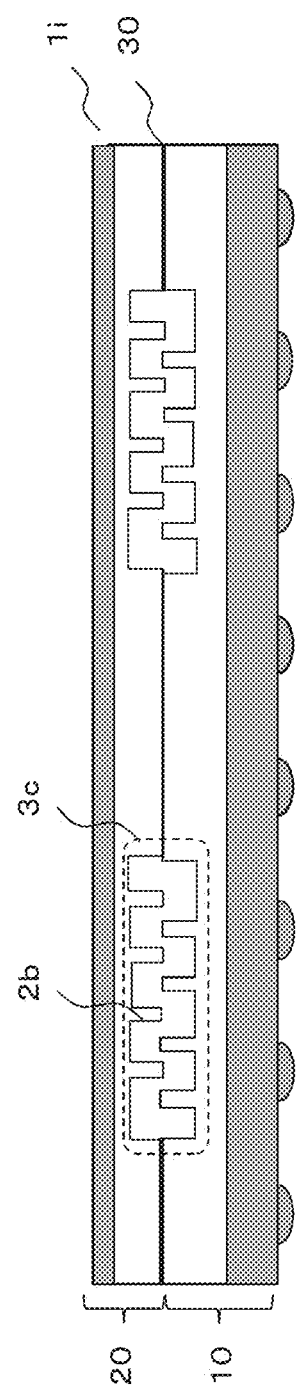
FIG. 11 shows a sectional view of an electronic component according to the sixth exemplary embodiment of the present invention.

The sixth exemplary embodiment of the present invention is explained. FIG. 11 is the sectional view of an electronic component 1i according to the sixth exemplary embodiment of the present invention. The electronic component 1*i* according to the exemplary embodiment is explained with reference to FIG. 11.

The exemplary embodiment is different from the first exemplary embodiment on a point that copper plating is not performed on a radiator 2*b* equipped in a cooling channel 3*c*. Therefore, the elements of the electronic component 1*i* are assigned the same reference numbers as those of the same elements of the first exemplary embodiment, and the descriptions are omitted.

In the exemplary embodiment, because copper plating is not performed on a radiator 2*b*, the radiation efficiency of radiator of the cooling channel 3*c* is lower than that of the radiator 2 on which copper plating was performed, when compared with the first exemplary embodiment. However, because copper plating is not performed on the radiator 2*b*, the number of manufacturing steps of the electronic component 1*i* can be reduced.

Therefore, in the exemplary embodiment, an effect of cost cutting can be produced by reducing the number of manufacturing steps.

Incidentally, in the exemplary embodiment, copper plating can be performed only on the radiator 2 formed at the cooling channel 3*c* formed one side of the semiconductor substrate.

Seventh Exemplary Embodiment

The seventh exemplary embodiment of the present invention is explained. FIG. 12 is the sectional view of an electronic component 1*j* according to the seventh exemplary embodiment of the present invention. The electronic component 1*j* according to the exemplary embodiment is explained with reference to FIG. 12.

The exemplary embodiment is different from the first exemplary embodiment on a point that, instead of direct connecting the semiconductor substrate 10 with the semiconductor substrate 20, the electronic component 1*j* electrically connects at the junction part 30 by connection terminals (not shown in the diagram), connecting bumps 22, and TSV (not shown in the diagram) equipped on each substrate. The underfill 52 is filled into gaps other than a cooling channel 3*d* at the junction part 30. The elements of the electronic component 1*j* are assigned the same reference numbers as those of the same elements of the first exemplary embodiment, and the descriptions are omitted.

The semiconductor substrate 10 and the semiconductor substrate 20 are electrically connected by the connection terminals, the connecting bumps 22 and TSV which are equipped on each substrate. Consequently, because a gap is formed between the semiconductor substrate 10 and the semiconductor substrate 20, a cross-sectional area of the cooling channel 3*d* is larger than that of the first exemplary embodiment.

Therefore, because the cross-sectional area of the cooling channel 3*d* is larger than that of the first exemplary embodiment, an effect of improving the cooling efficiency can be produced when compared with the first exemplary embodiment. In addition, because the cross-sectional area of the cooling channel 3*d* is larger than that of the first exemplary embodiment, pressure loss caused by the cooling channel 3*d*, which are generated by the pump 80 shown in FIG. 5 to flow the cooling medium, can be reduced, when the electronic component 1*j* is used in the electronic components module shown in FIG. 5 instead of the electronic component 1. Because a driving capability of the pump 80 can be reduced, an effect that the structure of the electronic component 1*j* reduces electric power consumption for driving a motor of the pump 80 can be produced.

Incidentally, if, in other exemplary embodiments, the cross-sectional area of the cooling channel can be enlarged compared with the first exemplary embodiment, a similar effect as the above can be produced.

Eighth Exemplary Embodiment

The eighth exemplary embodiment of the present invention is explained. FIG. 13 is the sectional view of an electronic component 1*k* according to the eighth exemplary embodiment of the present invention. The electronic component 1*k* according to the exemplary embodiment is explained with reference to FIG. 13.

The exemplary embodiment is different from the first exemplary embodiment on a point that a wall of a cooling channel 3*e* has a metal wall 5 on which copper plating was performed. Therefore, the elements of the electronic component 1*k* are assigned the same reference numbers as those of the same elements of the first exemplary embodiment, and the descriptions are omitted.

In the exemplary embodiment, because a wall of the cooling channel 3*e* has the metal wall 5 on which copper plating was performed, a cross-sectional area of the cooling channel is small as compared with the first exemplary embodiment. However, an effect of improving efficiency of heat transfer to cooling medium for radiating heat which the electronic component 1*k* generates can be produced.

Therefore, the electronic component 1*k* can effectively radiate heat generated inside of the electronic component, and produce a cooling effect.

Incidentally, in the exemplary embodiment, although it has described that a wall part of the cooling channel 3*e* has a metal wall on which copper plating was performed, a plating material of the metal wall is not limited to copper. For example, aluminum can be used for the plating material of the metal wall equipped in the cooling channel 3*e*. That is, the plating material can be used for plating of the metal wall, if the plating material has higher thermal conductivity than that of a semiconductor material such as silicon or germanium, such as copper or aluminum or the like.

Ninth Exemplary Embodiment

The ninth exemplary embodiment of the present invention is explained. FIG. 14 is the sectional view of an electronic component 1*l* according to the ninth exemplary embodiment of the present invention. The electronic component 1*l* according to the exemplary embodiment is explained with reference to FIG. 14.

The exemplary embodiment is different from the eighth exemplary embodiment on a point that a heat collection plate 6 connected to the metal wall 5 of a cooling channel 3*f* is equipped. Therefore, the elements of the electronic component 1*l* are assigned the same reference numbers as those of the same elements of the eighth exemplary embodiment, and the descriptions are omitted.

In the exemplary embodiment, the heat collection plate 6 connected with the metal wall 5 of the cooling channel 3*f* is formed by the same metal as the metal wall 5. For example, when the metal wall 5 of the copper plating on the cooling channel 3*f* of the semiconductor substrate 10 is formed, the first concave part connected with the metal wall 5 is formed by an etching. After that, by copper plating on the wall of the cooling channel and the first concave part connected with the wall, the heat collection plate 6 connected with the metal wall 5 and made of a copper plating material is formed at the first concave part. Because the heat collection plate 6 is formed using copper which has higher thermal conductivity than semiconductor material such as silicon or germanium, the heat collection plate 6 transfers heat which the electronic component 1l generates at inside of the semiconductor substrate to the metal wall 5 of the cooling channel 3f.

That is, because the heat collection plate 6 can efficiently transfer heat which the electronic component 1l generates to the cooling channel when compared with the eighth exemplary embodiment, an effect of improving the cooling efficiency can be produced.

Therefore, the electronic component 1l can effectively radiate heat generated inside of the electronic component, and produce a cooling effect.

Incidentally, in the exemplary embodiment, although it has described that the heat collection plate connected with the cooling channel 3f was formed by a copper plating material, the plating material of the heat collection plate is not limited to copper. For example, aluminum can be used for the plating material of the heat collection plate connected with the cooling channel 3f. That is, the plating material can be used for plating of the heat collection plate, if the plating material has higher thermal conductivity than that of a semiconductor material such as silicon or germanium, such as copper or aluminum or the like and can be used also for plating of the metal wall of the cooling channel described in FIG. 13.

In addition, in the exemplary embodiment, although it has described that the heat collection plate connected with the cooling channel 3f was formed by plating, a forming method of the heat collection plate is not limited to plating. For example, the heat collection plate can be formed by vapor deposition or CVD (Chemical Vapor Deposition) or the like. In addition, in the exemplary embodiment, there is no limitation on the shape of the heat collection plate connected with the cooling channel 3f. For example, the shape of the heat collection plate can be plate-shaped or lattice-shaped one.

That is, the heat collection plate has only to avoid electrical connections among the electronic components, to be formed so as to connect with the metal wall of the cooling channel, to transfer heat which the electronic component internally generates to the cooling channel and to radiate heat to the cooling medium. There is no limitation on a forming method and the shape of the heat collection plate.

Further, in the exemplary embodiment, the heat collection plate connected with the cooling channel 3f can be formed at one side or both sides of the semiconductor substrate on which the cooling channel is equipped.

Tenth Exemplary Embodiment

The tenth exemplary embodiment of the present invention is explained. FIG. 15 is the sectional view of an electronic component 1m according to the tenth exemplary embodiment of the present invention. The electronic component 1m according to the exemplary embodiment is explained with reference to FIG. 15.

The exemplary embodiment is different from the ninth exemplary embodiment on a point that a heat collection object 7 is additionally equipped at the heat collection plate 6 connected with the metal wall 5 of a cooling channel 3g. Therefore, the elements of the electronic component 1m are assigned the same reference numbers as those of the same elements of the ninth exemplary embodiment, and the descriptions are omitted.

In the exemplary embodiment, the heat collection object 7 is formed at the heat collection plate 6 connected with the metal wall 5 of the cooling channel 3g. That is, when the metal wall 5 of the cooling channel 3g of the semiconductor substrate 10 is formed, the first concave part connected with the metal wall 5 is formed by etching. The second concave part is formed deeper than the first concave part, at a part of the first concave part. After that, by performing copper plating on the wall of the cooling channel, the first concave part connected with the wall and the second concave part equipped in the first concave part, heat collection plate 6 connected with the metal wall 5 is formed in the first concave part. Further, the heat collection object 7 made of the copper plating material is formed at the second concave part deeper than the first concave part, at the part of the first concave part for which the heat collection plate 6 is formed. The heat collection object 7 is connected by the copper plating material with the metal wall 5 of cooling channel 3g and the heat collection plate 6. Similar to the heat collection plate 6, the heat collection object 7 is formed by copper which has higher thermal conductivity than semiconductor materials such as silicon or germanium.

Therefore, the heat collection object 7 transfers heat generated by the electronic component 1m from the inside of the semiconductor substrate to the metal wall 5 of the cooling channel 3g via the heat collection plate 6 by heat transfer. Because the heat collection object 7 is additionally formed in the heat collection plate 6, the electronic component 1m can transfer heat generated by the electronic component 1m with wider area compared with the ninth exemplary embodiment.

That is, because the heat collection object 7 more efficiently transfer heat which the electronic component 1m generates to the cooling channel, an effect of improving the cooling efficiency can be produced when compared with the ninth exemplary embodiment.

Therefore, the electronic component 1m can effectively radiate heat generated inside of the electronic component, and produce a cooling effect.

Incidentally, in the exemplary embodiment, although it has described that the heat collection object connected with the cooling channel 3g was formed by the copper plating material, the plating material of the heat collection object is not limited to copper. For example, aluminum can be used for a plating material of the heat collection object. That is, the plating material can be used for plating of the heat collection object, if the plating material has higher thermal conductivity than a semiconductor material such as silicon or germanium, such as copper or aluminum or the like can be used for plating as is similar to heat collection plate 6 and the metal wall 5 of the cooling channel described in FIG. 14.

In addition, in the exemplary embodiment, although it has described that the heat collection object connected with the cooling channel 3g was formed by plating, a forming method of the heat collection object is not limited to plating. For example, the heat collection object can be formed by vapor deposition or CVD or the like as is similar to the heat collection plate described in FIG. 14. In addition, in the exemplary embodiment, there is no limitation on the shape of the heat collection object connected with the cooling channel 3g. For example, the shape of the heat collection object can be plate-shaped, lattice-shaped or cylinder-shaped one.

That is, the heat collection object has only to avoid electrical connections among the electronic components, to be formed so as to connect with the metal wall of the cooling channel and the heat collection plate of the cooling channel, to transfer heat which the electronic component internally generates to the cooling channel and to radiate heat to the cooling medium. There is no limitation on a forming method and the shape of the heat collection object.

Further, in the exemplary embodiment, the heat collection object connected with the cooling channel 3g can be formed at one side or both sides of the semiconductor substrate that equips the cooling channel.

Incidentally, the present invention is not limited to each of above-mentioned exemplary embodiments and various changes in form and implementations can be made within the scope of the present invention.

For example, in each exemplary embodiment of the present invention, it is assumed that liquid is used as the cooling medium. However, the cooling medium has only to be a medium which can flow in the cooling channel of the electronic components and can transfer heat generated inside of the electronic components. There is no reason to restrict the cooling medium to liquid. Therefore, appropriate and adequate fluid including gas of specific elements, water or other liquids can be used as the cooling medium, in accordance with the electronic components, the laminated electronic components, the electronic components modules and the cooling system to which the present invention is applied.

In addition, the present invention is possible to appropriately replace or mixture these electronic components described in the first exemplary embodiment with electronic components described in the second exemplary embodiment to the tenth exemplary embodiment. Alternatively, electronic components described in the first exemplary embodiment can include other heat generating electronic components.

The technology of the continuous cavity disclosed in the patent literature 1 cannot be expected to radiate sufficiently heat to the cooling medium, because silicon is a major material as the heat conductor of the cooling channel and thereby thermal conductivity becomes low compared with metal such as copper.

Because technology disclosed in the patent literature 2 is a technology to flow the cooling medium in internal space formed between an interposer and a cover and cool surfaces of electronic components, the technology disclosed in the patent literature 2 cannot be expected to radiate sufficiently heat generated inside of the electronic components.

Therefore, in the technology disclosed in the patent literature 1 and patent literature 2, there is a problem that it cannot be expected that an effect in cooling internal heat in accordance with increase of thermal density caused by downsizing, higher integration and denser packaging of the electronic components is produced sufficiently. That is, in technologies disclosed in the patent literature 1 and patent literature 2, there is a problem that heat generated internally in the electronic components is not sufficiently transferred to the cooling medium.

According to the present invention, it is possible to effectively radiate heat which the electronic components internally generate, and produce a cooling effect.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

Further, it is the inventor's intention to retain all equivalents of the claimed invention even if the claims are amended during prosecution.

The invention claimed is:

1. An electronic component comprising:
   a base substance;
   a cooling channel formed in the base substance and a cooling medium flows therein in the predetermined direction;
   a radiator formed in a surface of the cooling channel using a material of which thermal conductivity is higher than a thermal conductivity of the base substance or formed so that the radiator may project to the cooling channel, and that contacts the cooling medium; and
   a heat collection plate formed in the vicinity of the base substance and connected to it thermally.

2. The electronic component according to claim 1, wherein a part or all part of a surface of the radiator which surface contacts with the cooling medium has a metal surface.

3. The electronic component according to claim 1, wherein a part or all part of a surface of the cooling channel which surface contacts with the cooling medium has a metal surface.

4. The electronic component according to claim 1, further comprising a heat collection object formed in the inside of the base substance so as to connect with a part of the heat collection plate and transfers the heat to the heat collection plate.

5. The electronic component according to claim 1, wherein
   the base substance includes a first semiconductor substrate and a second semiconductor substrate laminated on the first semiconductor substrate, and
the cooling channel is formed in a junction of the first semiconductor substrate and the second semiconductor substrate.

6. A laminated electronic component comprising:
   the electronic component according to claim 1; and
   an interposer on which the electronic components are laminated.

7. An electronic components module comprising:
   a lid which includes an inflow port which makes the cooling medium flowing the cooling channel with which an electronic component comprising:
   a base substance;
   a cooling channel formed in the base substance and a cooling medium flows therein in the predetermined direction,
   a radiator formed in a surface of the cooling channel using a material of which thermal conductivity is higher than a thermal conductivity of the base substance or formed so that the radiator may project to the cooling channel, and that contacts the cooling medium; and
   a heat collection plate formed in the vicinity of the base substance and connected to it thermally,
the electronic component is equipped an inflow port which makes the cooling medium flow into the cooling channel from the first direction and an outflow port which makes the cooling medium flow out of the second direction into an exterior of the cooling channel, and which covers the electronic component or the laminated electronic component.

8. A cooling system comprising:
   an electronic components module comprising:
   a lid which includes an inflow port which makes the cooling medium flowing the cooling channel with which an electronic component comprising:
   a base substance;
   a cooling channel formed in the base substance and a cooling medium flows therein in the predetermined direction,
   a radiator formed in a surface of the cooling channel using a material of which thermal conductivity is higher than a thermal conductivity of the base substance or formed so that the radiator may project to the cooling channel, and that contacts the cooling medium; and a heat collection plate formed in the vicinity of the base substance and connected to it thermally, the electronic component equipped an inflow port which makes the cooling medium flow into the cooling channel from the first direction and an outflow port which makes the cooling medium flow out of the second direction into an exterior of the cooling channel, and which covers the electronic component or the laminated electronic component, a heat dissipation means making a heat of the cooling medium radiate;

a flow means making the cooling medium flow; and a connecting means which connects the inflow port, the outflow port, the heat dissipation means and the flow means, and circulates the cooling medium.

9. An electronic components cooling method which comprises:

flowing a cooling medium in a second direction from a first direction of a cooling channel so that the cooling medium may contact a radiator formed in the cooling channel in a base substance of the electronic components using a material of which thermal conductivity is higher than a thermal conductivity of the base substance, or a radiator formed so as to project to the cooling channel in the base substance, and a heat collection plate formed in the vicinity of the base substance and the radiator and connected with both thermally.

\* \* \* \* \*